(12) United States Patent
Takemoto et al.

(10) Patent No.: US 9,949,374 B2
(45) Date of Patent: Apr. 17, 2018

(54) ELECTROLESS PLATING METHOD AND CERAMIC SUBSTRATE

(71) Applicant: Mitsubishi Electric Corporation, Chiyoda-ku, Tokyo (JP)

(72) Inventors: Yohei Takemoto, Tokyo (JP); Shiro Sekino, Tokyo (JP); Yuta Kaihatsu, Tokyo (JP); Hiromi Yamanaka, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 14/760,758

(22) PCT Filed: Feb. 4, 2014

(86) PCT No.: PCT/JP2014/052526
§ 371 (c)(1),
(2) Date: Jul. 14, 2015

(87) PCT Pub. No.: WO2014/123104
PCT Pub. Date: Aug. 14, 2014

(65) Prior Publication Data
US 2016/0007476 A1    Jan. 7, 2016

(30) Foreign Application Priority Data

Feb. 8, 2013    (JP) .................................. 2013-023212

(51) Int. Cl.
*B05D 3/10*    (2006.01)
*H05K 3/18*    (2006.01)
(Continued)

(52) U.S. Cl.
CPC ......... *H05K 3/185* (2013.01); *C23C 18/1639* (2013.01); *C23C 18/1651* (2013.01);
(Continued)

(58) Field of Classification Search
CPC . C23C 18/44; C23C 18/1886; C23C 18/1639; C23C 18/1651; C23C 18/36
(Continued)

(56) References Cited

U.S. PATENT DOCUMENTS

| 5,429,657 A | * | 7/1995 | Glicksman | ............... B22F 9/30 |
| | | | | 75/351 |
| 2010/0086807 A1 | * | 4/2010 | Nair | ..................... H05K 3/4661 |
| | | | | 428/672 |
| 2011/0129673 A1 | * | 6/2011 | Gupta | ..................... H01B 1/20 |
| | | | | 428/403 |

FOREIGN PATENT DOCUMENTS

| CN | 101473386 A | 7/2009 |
| CN | 102149847 A | 8/2011 |

(Continued)

OTHER PUBLICATIONS

International Search Report (PCT/ISA/210) dated Mar. 4, 2014, by the Japanese Patent Office as the International Searching Authority for International Application No. PCT/JP2014/052526.
(Continued)

*Primary Examiner* — Dah-Wei D Yuan
*Assistant Examiner* — Ngaleing V Law
(74) *Attorney, Agent, or Firm* — Buchanan Ingersoll & Rooney PC

(57) ABSTRACT

Provided is an electroless plating method for a low temperature co-fired glass ceramic substrate, the method including: a degreasing and activation treatment step of degreasing and activating a surface of a wiring pattern formed of a silver sintered body; a catalyzing step of providing a catalyst onto the surface of the wiring pattern formed of a silver sintered body; and an electroless multi-layered coating plating treatment step. The electroless plating method further includes, between the degreasing and activation treatment step and the catalyzing step, a silver precipitation treatment step of
(Continued)

precipitating silver on a glass component present on the surface of the wiring pattern formed of a silver sintered body after the degreasing and activation treatment step, and the catalyzing step includes providing the catalyst also to the silver precipitated in the silver precipitation treatment step.

9 Claims, 6 Drawing Sheets

(51) Int. Cl.
    *C23C 18/18*     (2006.01)
    *C23C 18/16*     (2006.01)
    *C23C 18/54*     (2006.01)
    *C23C 18/44*     (2006.01)
    *C23C 18/36*     (2006.01)
    *H05K 1/03*     (2006.01)
    *H05K 1/09*     (2006.01)

(52) U.S. Cl.
    CPC ...... *C23C 18/1844* (2013.01); *C23C 18/1886* (2013.01); *C23C 18/36* (2013.01); *C23C 18/44* (2013.01); *C23C 18/54* (2013.01); *H05K 1/0306* (2013.01); *H05K 1/092* (2013.01)

(58) Field of Classification Search
    USPC ........... 427/304, 305, 97.9, 99.5, 437, 443.1
    See application file for complete search history.

(56) References Cited

FOREIGN PATENT DOCUMENTS

| JP | 2003-231972 A | | 8/2003 | |
|---|---|---|---|---|
| JP | 2005-68489 A | | 3/2005 | |
| JP | 2005068489 A | * | 3/2005 | |
| JP | 2009-179845 A | | 8/2009 | |
| JP | 2009-249656 A A | | 10/2009 | |
| JP | 2012-504706 A | | 2/2012 | |
| WO | 2007/148773 A1 | | 12/2007 | |
| WO | 2010/040016 A2 | | 4/2010 | |
| WO | WO 2013083175 A1 | * | 6/2013 | ......... C23C 18/1641 |

OTHER PUBLICATIONS

Written Opinion (PCT/ISA/237) dated Mar. 4, 2014, by the Japanese Patent Office as the International Searching Authority for International Application No. PCT/JP2014/052526.

Preliminary Notice of Reasons for Rejection issued by the Japanese Patent Office in counterpart Japanese Application No. 2014-560763 dated Mar. 15, 2016 (6 pages).

Office Action (Notification of the First Office Action) dated Nov. 10, 2016, by the state intellectual property office of the People's Republic of China in corresponding Chinese Patent Application No. 201480007847.0, and an English Translation of the Office Action. (32 pages).

Office Action dated Nov. 1, 2016 by the Korean Patent Office, in corresponding Korean Patent Application No. 20157020856 (9 pages including partial English translation).

* cited by examiner

ELECTROLESS PLATING METHOD AND CERAMIC SUBSTRATE

TECHNICAL FIELD

The present invention relates to an electroless plating method for forming a plating coating on a surface of a wiring pattern in a glass ceramic substrate, in particular, a LTCC substrate to be used for an electronic component package or a wiring board, and to a ceramic substrate.

BACKGROUND ART

A ceramic substrate has hitherto widely been used for a wiring board for a multi-chip module package in which a plurality of semiconductor elements and a plurality of passive elements such as a capacitor and a resistor are mounted. A low temperature co-fired glass ceramic substrate (LTCC substrate), which is obtained by firing at low temperature, or the like is used as the ceramic substrate. The "low temperature" in the case of the low temperature co-fired glass ceramic substrate refers to a temperature range of from 850° C. to 1,000° C. The LTCC substrate includes an insulating base material formed of glass ceramic, and a wiring pattern formed of a sintered body containing as a main component a metal material (for example, silver) (wiring pattern formed of a silver sintered body).

The wiring pattern formed of a silver sintered body in the LTCC substrate is electrically connected to a semiconductor element or a passive element by wire bonding, and then connected to a printed board made of a resin serving as an external electrical circuit via solder. In general, a multi-layered electroless plating coating that satisfies both a wire bonding property and solderability necessary for the connection is formed on a surface of the wiring pattern. As constituents of the multi-layered electroless plating coating, a nickel plating coating, a gold plating coating, and in recent years, a palladium plating coating have been known.

As a method of forming the nickel plating coating, the gold plating coating, and the palladium plating coating selectively on the wiring pattern formed of a silver sintered body in the LTCC substrate, electroless plating has been widely used. The electroless plating generally involves a plurality of steps including a surface activation step, a catalyzing step, and a plurality of electroless plating steps of forming a multi-layered plating coating including an electroless nickel plating coating and the like.

In association with formation of the plating coating on the surface of the wiring pattern formed of a silver sintered body in the LTCC substrate, it has hitherto been known that, at the time of firing of the substrate, a phenomenon called glass floating, in which a glass component is formed on the surface of the wiring pattern formed of a silver sintered body, may occur. When the glass floating occurs, a non-plating state, in which the nickel plating coating is prevented from being formed on the glass component, may occur, or the plating coating may have an uneven thickness.

As a method of preventing such non-plating state, there has hitherto been known, for example, a method involving, between the surface activation step and the catalyzing step, a step of removing the glass component present on a surface to be subjected to electroless plating by using a pretreatment agent containing a reducing agent (see, for example, Patent Literature 1).

CITATION LIST

Patent Literature

[PTL 1] JP 2005-68489 A

SUMMARY OF INVENTION

Technical Problem

However, the related-art electroless plating method disclosed in Patent Literature 1 has the following problems.

The amount of the glass component to be contained in the wiring pattern formed of a silver sintered body generally varies depending on the combination of the wiring pattern formed of a silver sintered body and LTCC substrate to be used. The glass component formed on the surface of the wiring pattern formed of a silver sintered body owing to the glass floating varies in size depending on the combination of the wiring pattern formed of a silver sintered body and LTCC substrate to be used. When the glass component has a size exceeding 1 μm, the glass component may fail to be removed. In addition, when the glass component fails to be removed, non-plating, in which the nickel plating coating is prevented from being formed on the glass component, may occur.

In addition, when a glass component having a size exceeding 1 μm to 5 μm is removed, a recess may be generated in the surface of the wiring pattern formed of a silver sintered body. Further, when a recess is generated in the surface of the wiring pattern formed of a silver sintered body, the plating coating may be unevenly distributed, or voids may be generated in the plating coating. Further, when voids are generated in the plating coating, there is a risk in that a plating liquid or washing liquid used during electroless plating is taken in the voids, and its water content vaporizes during solder connection, which results in solder connection failure. This leads to a reduction in module reliability.

The present invention has been made for solving the above-mentioned problems, and an object of the present invention is to provide an electroless plating method and ceramic substrate, which prevent non-plating of the nickel plating coating, and suppress the formation of voids in the plating coating and accompanying solder connection failure, and thus realize improved module reliability.

Solution to Problem

According to one embodiment of the present invention, there is provided an electroless plating method for a low temperature co-fired glass ceramic substrate including an insulating base material formed of glass ceramic, and a wiring pattern formed of a silver sintered body, the electroless plating method including: a degreasing and activation treatment step of degreasing and activating a surface of the wiring pattern formed of a silver sintered body; a catalyzing step of providing a catalyst onto the surface of the wiring pattern formed of a silver sintered body after the degreasing and activation treatment step; and an electroless multi-layered coating plating treatment step of forming a multi-layered electroless plating coating on the surface of the wiring pattern formed of a silver sintered body on which the catalyst is provided, the electroless plating method further including, between the degreasing and activation treatment step and the catalyzing step, a silver precipitation treatment step of precipitating silver on a glass component present on the surface of the wiring pattern formed of a silver sintered body after the degreasing and activation treatment step, the catalyzing step including providing the catalyst also to the silver precipitated in the silver precipitation treatment step.

In addition, a ceramic substrate according to one embodiment of the present invention includes a multi-layered electroless plating coating formed by an electroless plating method for a glass ceramic substrate including an insulating base material formed of glass ceramic, and a wiring pattern formed of a silver sintered body, the method including: a degreasing and activation treatment step of degreasing and activating a surface of the wiring pattern formed of a silver sintered body; a silver precipitation treatment step of precipitating silver on a glass component present on the surface of the wiring pattern formed of a silver sintered body after the degreasing and activation treatment step; a catalyzing step of providing a catalyst onto the surface of the wiring pattern formed of a silver sintered body after the silver precipitation treatment step; and an electroless multi-layered coating plating treatment step of forming a multi-layered electroless plating coating on the surface of the wiring pattern formed of a silver sintered body on which the catalyst is provided.

Advantageous Effects of Invention

The electroless plating method according to one embodiment of the present invention can achieve the electroless plating method and ceramic substrate, which prevent non-plating of the nickel plating coating, and suppress the formation of voids in the plating coating and accompanying solder connection failure, and thus realize improved module reliability, because the silver precipitation treatment step of precipitating silver on a glass component present on the surface of the wiring pattern formed of a silver sintered body is included between the degreasing and activation treatment step and the catalyzing step.

DESCRIPTION OF EMBODIMENTS

First Embodiment

Figure 1:
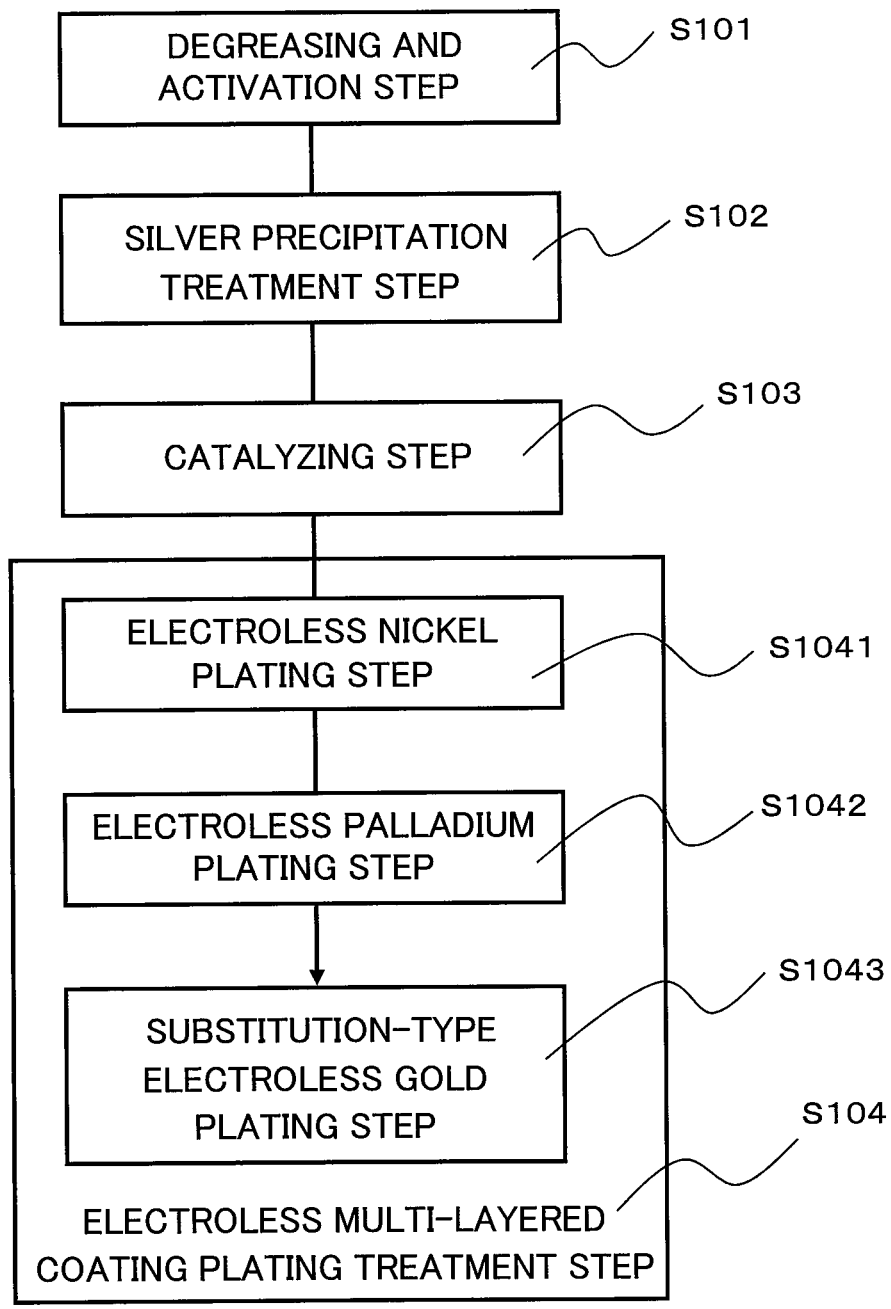
FIG. 1 illustrates a process flow according to a first embodiment of the present invention.

FIG. 1 illustrates a process flow according to a first embodiment of the present invention. An electroless plating method for a glass ceramic wiring board of FIG. 1 includes performing, on the surface of a wiring pattern formed of a silver sintered body, a degreasing and activation step (Step S101), a catalyzing step (Step S103), an electroless nickel plating step (Step S1041), an electroless palladium plating step (Step S1042), and a substitution-type electroless gold plating step (Step S1043). The electroless plating method of FIG. 1 further includes performing a silver precipitation treatment step (Step S102) between the degreasing and activation step and the catalyzing step.

The electroless nickel plating step (Step S1041), the electroless palladium plating step (Step S1042), and the substitution-type electroless gold plating step (Step S1043) are collectively referred to as electroless multi-layered coating plating treatment step (Step S104).

Figure 2:
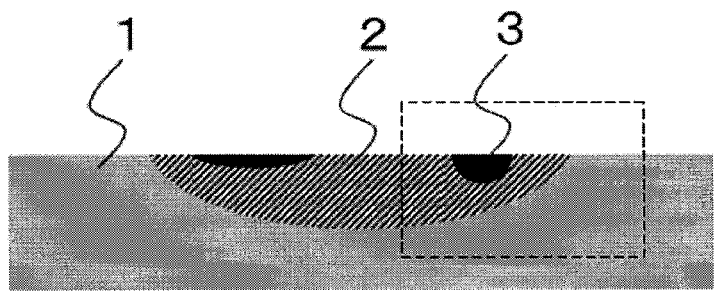
FIG. 2 is a sectional view illustrating a glass ceramic wiring board to be used in the first embodiment of the present invention.

FIG. 2 is a sectional view illustrating a glass ceramic wiring board to be used in the first embodiment of the present invention. As illustrated in FIG. 2, a glass ceramic wiring board (LTCC substrate) generally includes an insulating base material 1 formed of glass ceramic, and a wiring pattern 2 formed of a metal sintered body. The glass ceramic is preferably oxide-based ceramic formed of silicon dioxide, alumina, or the like. The wiring pattern 2 formed of a metal sintered body is appropriately designed depending on a desired electronic component package or wiring board. In addition, a metal sintered body for forming the wiring pattern 2 formed of a metal sintered body is selected so that characteristics required for an electronic component or the like to be subjected to electroless plating are satisfied. In the present invention, a silver-palladium alloy containing silver is used for the metal sintered body.

The wiring pattern 2 formed of a metal sintered body is hereinafter referred to as wiring pattern 2 formed of a silver sintered body. A glass component 3 is formed on the surface of the wiring pattern 2 formed of a silver sintered body.

Figure 3:
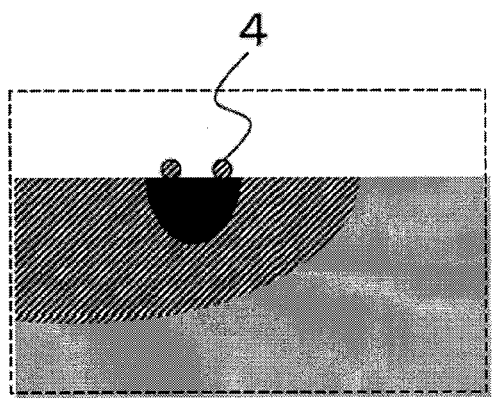
FIG. 3 is an enlarged view illustrating a state of a glass component portion formed on the surface of a wiring pattern formed of a silver sintered body of FIG. 2 after a silver precipitation treatment step.

Next, the steps are each described in detail.
<Degreasing and Activation Step>
First, in the degreasing and activation step of Step S101, an organic material, an oxide coating, or the like is removed from the surface of the wiring pattern 2 formed of a silver sintered body.
<Silver Precipitation Treatment Step>
Next, the silver precipitation treatment step is described with reference to FIG. 3. FIG. 3 is an enlarged view illustrating a state of the glass component 3 portion formed on the surface of the wiring pattern 2 formed of a silver sintered body of FIG. 2 after the silver precipitation treatment step.

In the silver precipitation treatment step of Step S102, a silver component in the glass component 3 present on the surface of the wiring pattern 2 formed of a silver sintered body is dissolved without damaging the wiring pattern 2 formed of a silver sintered body, and silver particles 4 are redeposited on the glass component 3, as illustrated in FIG. 3. That is, the silver precipitation treatment step is a step of precipitating the silver particles 4 on the glass component 3 present on the surface of the wiring pattern 2 formed of a silver sintered body that has been cleaned and activated in Step S101 by immersion in degreasing and activation treatment liquids.

The inventors of the present invention have found that the silver particles 4 have a property of being precipitated selectively on the glass component 3 present on the surface of the wiring pattern 2 formed of a silver sintered body, as illustrated in FIG. 3, by treating the surface of the wiring pattern 2 formed of a silver sintered body with a silver precipitation treatment liquid before providing a catalyst.

As the silver precipitation treatment liquid to be used in the silver precipitation treatment step, there may be used, for example, a silver precipitation treatment liquid containing 1 to 10 wt % of a reducing agent and 5 to 15 wt % of a complexing agent such as citric acid, malic acid, or succinic acid, and having a pH adjusted to from 4 to 6 with sulfuric acid or sodium hydroxide.

For example, the reducing agent preferably contains any one of the following first reducing agents, or the first reducing agent and the following second reducing agent in combination. Preferred examples of the first reducing agent include a phosphoric acid compound and an organic acid. In addition, a preferred example of the second reducing agent is an inorganic compound.

Hypophosphorous acid, sodium hypophosphite, or potassium hypophosphite is preferably used as the phosphoric acid compound.

Formic acid or citric acid is preferably used as the organic acid.

Iron(II) chloride, iron(II) sulfate, or sodium thiosulfate is preferably used as the inorganic compound.

The silver precipitation treatment liquid more preferably contains, as the first reducing agent, 1 to 10 wt % of hypophosphorous acid, sodium hypophosphite, or potassium hypophosphite, or 1 to 10 wt % of formic acid or citric acid. In addition, the silver precipitation treatment liquid preferably contains, as the second reducing agent, 1 to 100 ppm of iron(II) chloride, iron(II) sulfate, or sodium thiosulfate.

The silver precipitation treatment conditions are described below. The immersion time period for which the LTCC substrate is immersed in the silver precipitation treatment liquid is not particularly limited because the immersion time period is affected by the liquid temperature, treatment time period, and concentration of a catalyst providing liquid or nickel plating treatment liquid, but is generally preferably from 1 to 10 minutes. In addition, the liquid temperature of the silver precipitation treatment liquid is not particularly limited as long as silver can be precipitated, but is preferably adjusted to from 80° C. to 90° C. from the viewpoint of silver precipitation efficiency.

The silver precipitation treatment liquid is preferably used in the above-mentioned temperature range, but may be used by appropriately adjusting the liquid temperature in accordance with the state of the LTCC substrate. The silver precipitation treatment liquid is acidic.

The silver component, which has been diffused through firing, is present in the glass component 3 formed on the surface of the wiring pattern 2 formed of a silver sintered body owing to glass floating. The silver component is exposed by etching the surface of the glass component 3 in a trace amount with the silver precipitation treatment liquid, and dissolved and ionized in the silver precipitation treatment liquid by virtue of its acidity. Silver dissolved in the silver precipitation treatment liquid is deposited selectively on the glass component 3 present around the wiring pattern 2 formed of a silver sintered body, as illustrated in FIG. 3. The deposits are the silver particles 4. Silver dissolved in the silver precipitation treatment liquid is redeposited in a short time, and hence is prevented from being diffused in the treatment liquid.

Figure 4:
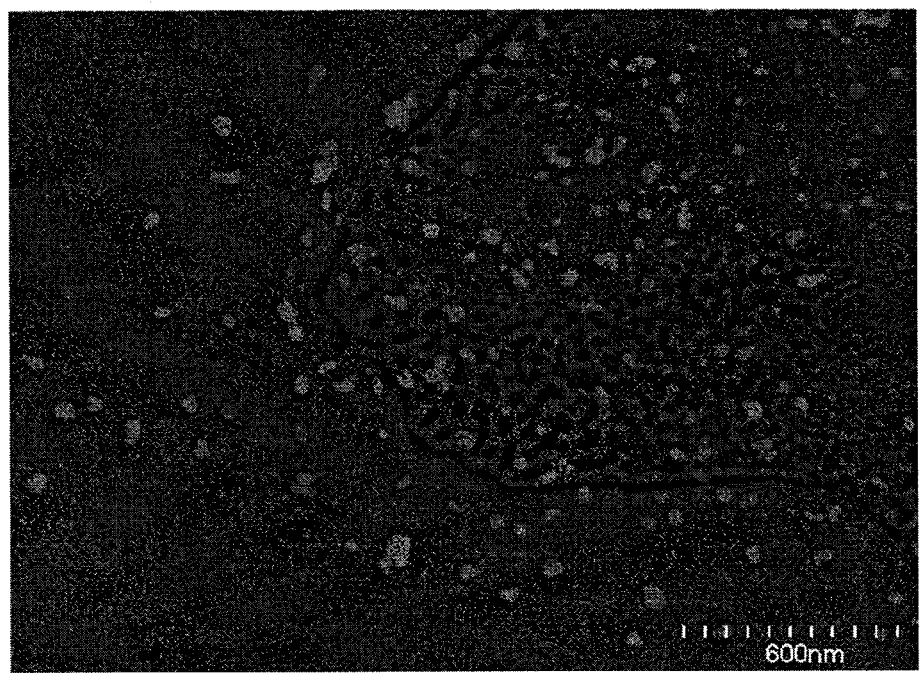
FIG. 4 is an electron micrograph showing the surface of the wiring pattern formed of a silver sintered body after the silver precipitation treatment step of the present invention.

That is, the silver component is instantly dissolved and redeposited, to be deposited almost selectively only on the glass component 3 present on the surface of the wiring pattern 2 formed of a silver sintered body, and on a white plate (glass) portion within 1 to 10 μm from the wiring pattern 2 formed of a silver sintered body. FIG. 4 is an electron micrograph showing the surface of the wiring pattern formed of a silver sintered body after the silver precipitation treatment step of the present invention. The glass component 3 is present in an upper right portion of FIG. 4. In addition, portions observed as white spots throughout FIG. 4 are the precipitated silver particles 4.

As shown in FIG. 4, the silver particles 4 are each deposited in a particulate form on the glass component 3. In addition, the silver particles 4 each have a particle size of from 10 to 100 nm.

<Catalyzing Step>

Next, in the catalyzing step of Step S103, the LTCC substrate is immersed in a catalyst liquid containing palladium or the like, to provide a palladium catalyst onto the surface of the wiring pattern 2 formed of a silver sintered body. Herein, the palladium catalyst is also provided to the silver particles 4 deposited on the surface of the wiring pattern formed of a silver sintered body in the silver precipitation treatment step.

Next, the electroless multi-layered coating plating treatment step of Step S104 is performed.

<Electroless Nickel Plating Step>

Figure 5:
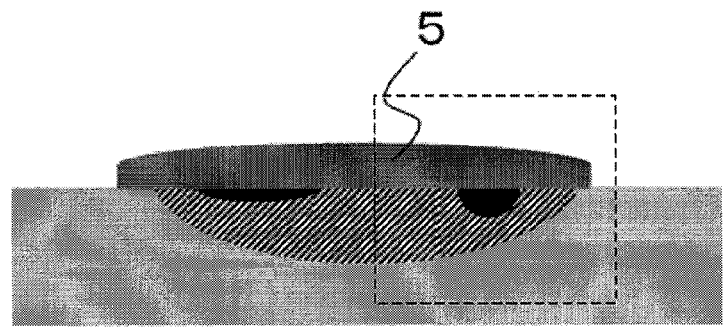
FIG. 5 is a sectional view illustrating a state in which the surface of the wiring pattern formed of a silver sintered body after a catalyzing step has been subjected to an electroless nickel plating step.
Figure 6:
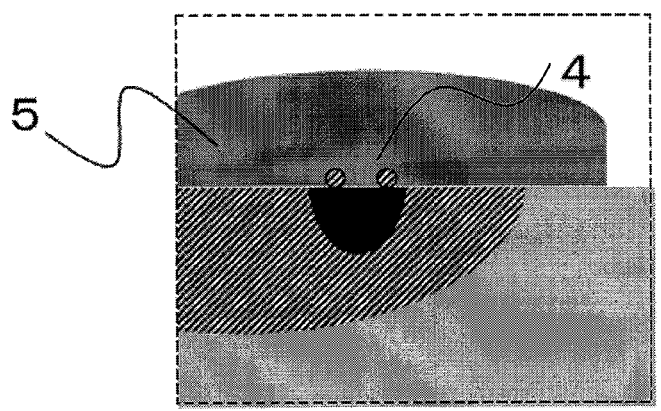
FIG. 6 is an enlarged view illustrating the glass component portion of FIG. 5 formed on the surface of the wiring pattern formed of a silver sintered body.

First, the electroless nickel plating step is described with reference to FIGS. 5 and 6. FIG. 5 is a sectional view illustrating a state in which the surface of the wiring pattern 2 formed of a silver sintered body after the catalyzing step has been subjected to the electroless nickel plating step. In addition, FIG. 6 is an enlarged view illustrating the glass component 3 portion of FIG. 5 formed on the surface of the wiring pattern 2 formed of a silver sintered body.

In the electroless nickel plating step of Step S1041, as illustrated in FIG. 5, an electroless nickel plating coating 5 is formed on the surface of the wiring pattern 2 formed of a silver sintered body. At this time, as illustrated in FIG. 6, the silver particles 4 deposited on the glass component 3 are each in a state of being formed in the electroless nickel plating coating 5.

As an electroless nickel plating liquid to be used in this step, any plating liquid for electroless nickel plating heretofore known may be used. For example, there may be used a plating liquid containing 2 wt % of nickel sulfate as a metal salt, 2 wt % of sodium hypophosphite as a reducing agent, and 10 wt % of citric acid, malic acid, succinic acid, or the like as a complexing agent, and having a pH adjusted to 4.5 with sulfuric acid or sodium hydroxide. In the present invention, the "wt %" refers to a value with respect to the entire prepared liquid, unless otherwise stated.

As the electroless nickel plating conditions, the immersion time period of the LTCC substrate in the electroless nickel plating liquid and the liquid temperature of the electroless nickel plating liquid may appropriately be set so that the electroless nickel plating coating achieves a desired thickness. For example, an electroless nickel plating coating having a thickness of about 4 µm is obtained by setting the liquid temperature and the plating time period to 80° C. and 20 minutes, respectively.

<Electroless Palladium Plating Step>

Figure 7:
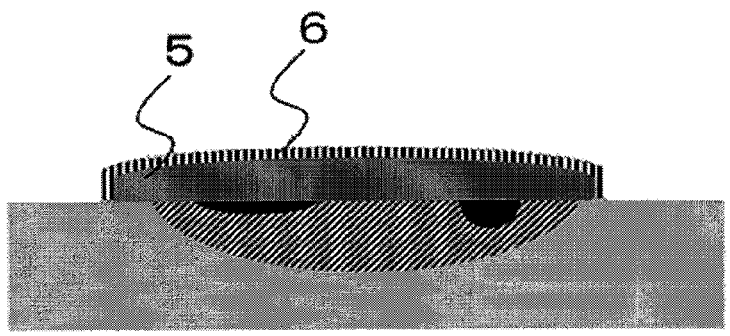
FIG. 7 is a sectional view illustrating a state in which the surface of the wiring pattern formed of a silver sintered body in the state of FIG. 5 has been subjected to an electroless palladium plating step.

Next, the electroless palladium plating step is described with reference to FIG. 7. FIG. 7 is a sectional view illustrating a state in which the surface of the wiring pattern 2 formed of a silver sintered body in the state of FIG. 5 has been subjected to the electroless palladium plating step.

In the electroless palladium plating step of Step S1042, as illustrated in FIG. 7, an electroless palladium plating coating 6 is formed on the electroless nickel plating coating 5 formed in the electroless nickel plating step (S1041). As an electroless palladium plating liquid to be used in the step, a hypophosphorous acid-based palladium plating liquid, a phosphorous acid-based palladium plating liquid, or a formate-based palladium plating liquid, which has hitherto been used, may be used. As the hypophosphorous acid-based liquid, for example, the following plating liquid is used: a plating liquid containing palladium chloride as a metal salt, a palladium compound such as palladium acetate, sodium hypophosphite as a reducing agent, an amine compound as a complexing agent such as ethylenediaminetetraacetic acid, a pH adjuster, and the like.

As the electroless palladium plating conditions, the immersion time period of the LTCC substrate in the electroless palladium plating liquid and the liquid temperature of the electroless palladium plating liquid may appropriately be set so that the electroless palladium plating coating 6 achieves a desired thickness. For example, in the case of using the hypophosphorous acid-based electroless palladium plating liquid, an electroless palladium plating coating 6 having a thickness of about 0.1 µm is obtained by setting the liquid temperature and the plating time period to 50° C. and 5 minutes, respectively.

<Substitution-Type Electroless Plating Step>

Figure 8:
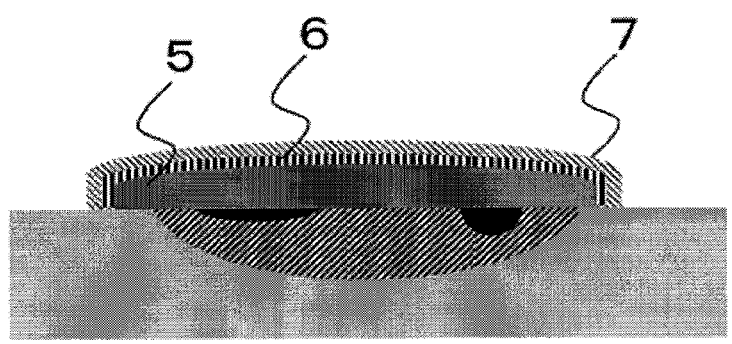
FIG. 8 is a sectional view illustrating a state in which the surface of the wiring pattern formed of a silver sintered body in the state of FIG. 7 has been subjected to a substitution-type electroless plating step.

Next, a substitution-type electroless plating step is described with reference to FIG. 8. FIG. 8 is a sectional view illustrating a state in which the surface of the wiring pattern 2 formed of a silver sintered body in the state of FIG. 7 has been subjected to the substitution-type electroless plating step.

In the substitution-type electroless gold plating step of Step S1043, as illustrated in FIG. 8, a substitution-type electroless gold plating coating 7 is formed on the electroless palladium plating coating 6 formed in the electroless palladium plating step. As a substitution-type electroless gold plating liquid to be used in this step, a cyanogen-based gold plating liquid or a gold sulfite-based gold plating liquid, which has hitherto been used, may be used. As the cyanogen-based plating liquid, there may be used, for example, a plating liquid containing gold potassium cyanide as a metal salt, ethylenediaminetetraacetic acid, citric acid, or the like as a complexing agent, a pH adjuster, and the like. In addition, as the gold sulfite-based plating liquid, there may be used a plating liquid containing gold sodium sulfite or the like as a metal salt, and sodium sulfite, ethylenediamine, or the like as a complexing agent.

As the substitution-type electroless plating conditions, the immersion time period of the LTCC substrate in the substitution-type electroless gold plating liquid and the liquid temperature of the substitution-type electroless gold plating liquid may appropriately be set so that the substitution-type electroless gold plating coating achieves a desired thickness. For example, in the case of using the cyanogen-based substitution-type electroless gold plating liquid, a substitution-type electroless gold plating coating having a thickness of 0.05 µm is obtained by setting the liquid temperature and the plating time period to 90° C. and 10 minutes, respectively. Thus, a glass ceramic substrate illustrated in FIG. 8 is obtained.

That is, as illustrated in FIG. 8, the glass ceramic substrate to be obtained through Steps S101 to S104 includes: the nickel plating coating 5 formed on the wiring pattern 2 formed of a silver sintered body including the silver particles 4 deposited on the glass component 3 and the glass component 3; the palladium plating coating 6 formed on the nickel plating coating 5; and the substitution-type gold plating coating 7 formed on the palladium plating coating 6.

After the electroless plating treatment, the LTCC substrate is subjected to wire bonding treatment, soldering, or the like, as an implementation step.

Such electroless plating method, which includes, between the degreasing and activation step and the catalyzing step, the metal precipitation treatment step of depositing the silver particles 4 on the glass component 3 present on the surface of the wiring pattern 2 formed of a silver sintered body, allows the catalyst to be provided also to the deposited silver particles 4. With this, non-plating during the electroless nickel plating can be prevented. In addition, the wiring pattern 2 formed of a silver sintered body is well plated with nickel in the electroless nickel plating step. Further, the surface of the wiring pattern 2 formed of a silver sintered body can be prevented from being recessed.

In addition, the formation of voids can be suppressed in the plating coating, because the surface of the wiring pattern 2 formed of a silver sintered body can be prevented from being recessed. With this, the plating liquid or washing liquid used during the plating can be prevented from being taken in the voids, and thus vaporization of the water content during solder connection and accompanying solder connection failure can be prevented. Thus, the LTCC substrate can achieve improved module reliability.

In addition, the use of the silver precipitation treatment liquid, which contains as a first reducing agent a phosphoric acid compound or an organic acid and as a second reducing agent an inorganic compound at specific concentrations and has a pH adjusted to from 4 to 6, allows silver to be more reliably precipitated on the glass component 3 present on the surface of the wiring pattern 2 formed of a silver sintered body. With this, the effects of suppressing the formation of voids in the plating coating and preventing the non-plating of the plating coating can be enhanced.

Further, the adhesion force between the wiring pattern 2 formed of a silver sintered body and the plating coating can be increased by an anchor effect of the plating coating. With this, the module reliability of the LTCC substrate can be improved.

According to the first embodiment, the metal precipitation treatment step is performed between the degreasing and activation step and the catalyzing step, as described above. As a result, silver is precipitated on the glass component present on the surface of the wiring pattern formed of a silver sintered body, and thus the non-plating state caused by glass floating can be prevented. In consequence, the non-plating of the nickel plating coating can be prevented, and the formation of voids in the plating coating, and accompanying solder connection failure can be suppressed. Thus, improved module reliability can be achieved.

Second Embodiment

Figure 9:
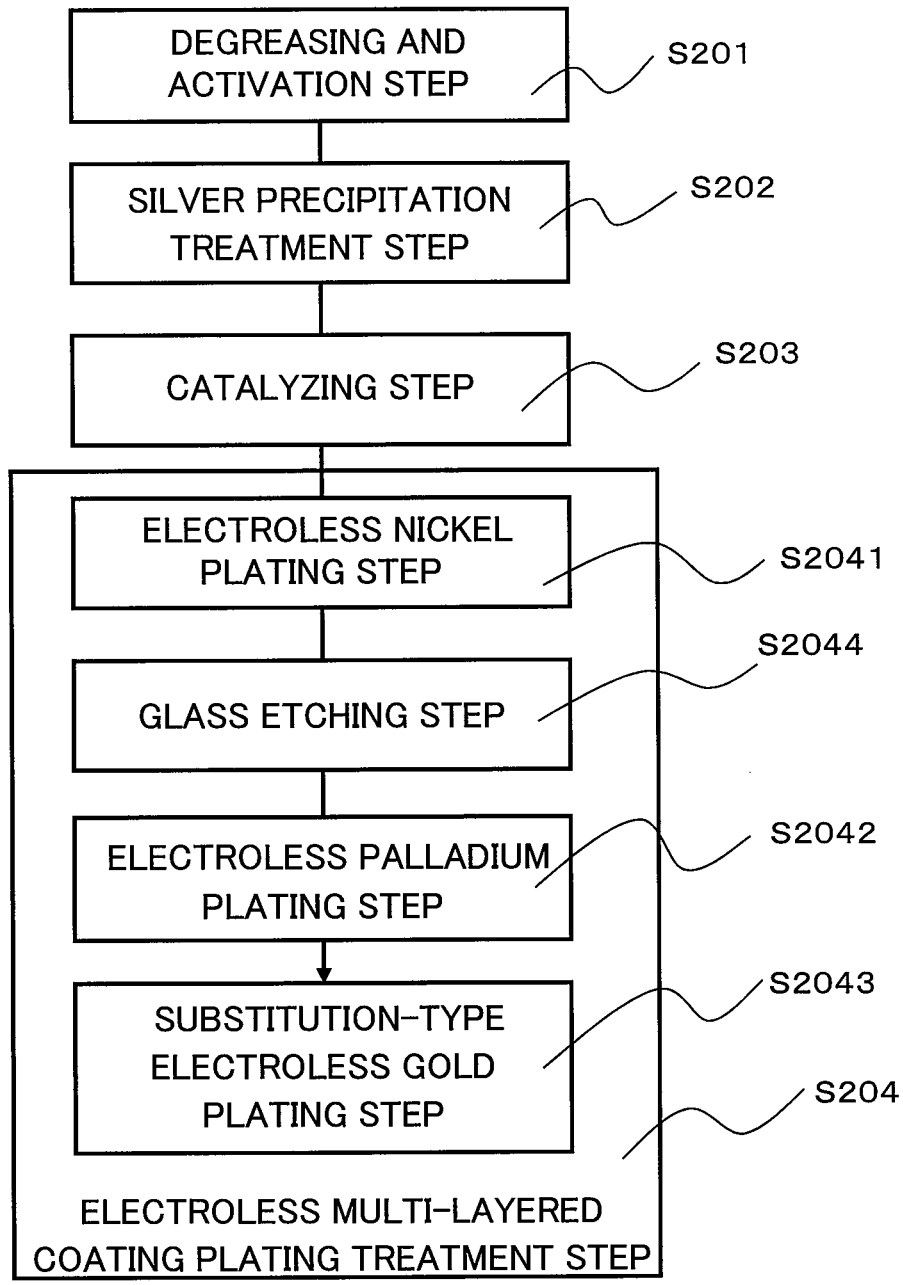
FIG. 9 illustrates a process flow according to a second embodiment of the present invention.

FIG. 9 illustrates a process flow according to a second embodiment of the present invention. In the first embodiment, the electroless plating method including the degreasing and activation step, the silver precipitation treatment step, the catalyzing step, the electroless nickel plating step, the electroless palladium plating step, and the substitution-type electroless gold plating step in this order is described. In contrast, in the second embodiment, an electroless plating method including, in addition to the steps of the first embodiment, a glass etching step between the electroless nickel plating step and the electroless palladium plating step is described.

When the wiring patterns 2 formed of a silver sintered body in the first embodiment have a narrow space therebetween, for example, have a space of 10 µm or less, palladium may be anomalously deposited on the deposited silver in the electroless palladium plating step, to cause a short circuit between the patterns. Therefore, in the second embodiment, etching treatment is performed between the electroless nickel plating step and the electroless palladium plating step. Other configurations are the same as those in the first embodiment.

In FIG. 9, a degreasing and activation step of Step S201 is the same step as Step S101 of FIG. 1 in the first embodiment.

In addition, a silver precipitation treatment step of Step S202 is the same step as Step S102 of FIG. 1 in the first embodiment.

Further, a catalyzing step of Step S203 is the same step as Step S103 of FIG. 1 in the first embodiment.

In addition, an electroless nickel plating step (Step S2041), an electroless palladium plating step (Step S2042), and a substitution-type electroless gold plating step (Step S2043) in an electroless multi-layered coating plating treatment step of Step S204 are the same steps as Step S1041, Step S1042, and Step S1043 in Step S104 of FIG. 1 in the first embodiment, respectively.

It should be noted that the process flow of the second embodiment differs from that of the first embodiment in that a glass etching treatment step of Step S2044 is added between Step S2041 and Step S2042. Now, Step S2044 is hereinafter described in detail.

<Glass Etching Treatment Step>

In the glass etching treatment step of Step S2044, fine particles formed on glass ceramic between the wiring patterns 2 formed of a silver sintered body, which cause a short circuit between the patterns, are dissolved and removed with a glass etching liquid, without damaging the surface of the patterns.

The fine particles are, for example, metal fine particles having an average particle size of about from 0.05 µm to 0.5 µm derived from the metal sintered body serving as a constituent of the wiring pattern. In this case, where the metal sintered body is formed of a silver-palladium alloy, silver fine particles are exemplified as the fine particles.

A glass etching liquid containing any of an inorganic acid, a fluoride, and an alkali metal hydroxide is preferably used as the glass etching liquid to be used in the glass etching treatment step.

For example, hydrochloric acid or sulfuric acid is preferably used as the inorganic acid, hydrogen fluoride or ammonium fluoride is preferably used as the fluoride, and sodium hydroxide is preferably used as the alkali metal hydroxide.

It is more preferred to use any one of hydrochloric acid having a concentration adjusted to from 2 to 6 wt %, sulfuric acid having a concentration adjusted to from 5 to 15 wt %, hydrofluoric acid having a concentration adjusted to from 0.1 to 0.5 wt %, an ammonium fluoride aqueous solution having a concentration adjusted to from 0.5 to 1.0 wt %, and a sodium hydroxide aqueous solution having a concentration adjusted to from 2 to 6 wt %. Such glass etching liquid having a specified concentration as described above can remarkably enhance the effect of removing the fine particles.

The glass etching treatment conditions are described below. The immersion time period of the LTCC substrate in the glass etching liquid is not particularly limited because the immersion time period is affected by the liquid temperature of the glass etching liquid or the like, but is generally preferably from 3 to 5 minutes.

The highly acidic or highly basic glass etching liquid containing the inorganic acid or the alkali metal hydroxide can efficiently dissolve glass, which is generally difficult to be dissolved with any material other than a fluoride, when the glass etching liquid is used at 40° C. or more. The liquid temperature is not particularly limited as long as the etching can be performed, but is preferably adjusted to from 40° C. to 60° C. from the viewpoints of etching efficiency, protection of the wiring pattern, and the like.

A combination of the liquid temperature and treatment time period of the glass etching treatment is, for example, as follows: in the case of using as the glass etching liquid a 4 wt % sodium hydroxide aqueous solution, the liquid temperature is preferably from 40 to 60° C., and the treatment time period is preferably from 3 to 5 minutes.

Alternatively, the glass etching liquid containing the fluoride can be used for the treatment at room temperature, but may be used after being adjusted to an appropriate temperature.

The fluoride can remove the fine particles through glass etching and render the surface of the glass ceramic water repellent, and hence can suppress the anomalous deposition of palladium. The glass ceramic is generally an oxide containing as a main component a silicate salt. Its outermost surface is terminated with a hydroxyl group, and hence is hydrophilic and highly reactive.

However, the terminal hydroxyl group attached to silicon in the glass ceramic is terminated with hydrogen through treatment using the glass etching liquid containing the fluoride such as hydrofluoric acid. As a result, the surface of the glass ceramic becomes hydrophobic as compared to the case of the hydroxyl group-terminated glass ceramic, and thus has a lower reactivity. In the case of using the etching liquid containing the fluoride, the glass ceramic is dissolved, and as a result, the fine particles, which cause the anomalous deposition of palladium, are largely removed by liftoff, as in the case of using the etching liquid containing the inorganic acid or the alkali metal hydroxide.

Even when fine particles that are not removed by the treatment using the fluoride remain, the entire surface of the glass ceramic exhibits water repellent action by being terminated with hydrogen as described above, and thus has a low reactivity. As a result, the remaining fine particles are prevented from being brought into contact with and reacting with the electroless palladium plating liquid in the next step, and thus palladium is prevented from being deposited on the fine particles.

In addition, other than the above-mentioned etching liquids, a highly acidic organic acid such as maleic acid, or sodium carbonate, which is highly basic, may be utilized as the glass etching liquid. In the case of using such glass etching liquid, the concentration of the glass etching liquid, the liquid temperature and immersion time period of the etching treatment, and the like may be appropriately adjusted, as in the case of using the etching liquid containing the inorganic acid, the alkali metal hydroxide, or the fluoride.

It should be noted that the glass etching liquid in the second embodiment is substantially free of cyanogen and sulfur. The "substantially free of" means that cyanogen and sulfur are in no danger of inducing inactivation or corrosion that damages a desired conductor pattern.

In addition, the "water repellent" in the second embodiment means that the surface is hydrophobic and has a low reactivity as compared to the one terminated with a hydroxyl group. The water repellency (hydrophobicity) may be compared based on a value determined by wetting angle measurement. The treatment using the fluoride can suppress the anomalous deposition of palladium by double effects of glass etching and inactivating the surface of the glass ceramic.

Further, in the second embodiment, the glass etching treatment step can remarkably enhance the effect of removing the fine particles by subjecting the glass ceramic substrate to ultrasonic treatment while the glass ceramic substrate is immersed in the glass etching liquid. In addition, in the case of performing ultrasonic treatment as just described, the immersion time period can be set shorter than usual.

A glass ceramic substrate to be thus obtained through Steps S201 to S204 is the same as that to be obtained in the first embodiment. That is, as illustrated in FIG. 8, the glass ceramic substrate includes: the nickel plating coating 5 formed on the wiring pattern 2 formed of a silver sintered body including the silver particles 4 deposited on the glass component 3 and the glass component 3; the palladium plating coating 6 formed on the nickel plating coating 5; and the substitution-type gold plating coating 7 formed on the palladium plating coating 6. In addition, the silver particles 4 deposited on the glass component 3 are formed in the nickel plating coating 5.

As described above, the electroless plating method according to the second embodiment, which includes the glass etching step between the electroless nickel plating step and the electroless palladium plating step, can suppress the deposition of palladium on the deposited silver. As a result, a short circuit between the patterns can be prevented.

Third Embodiment

Figure 10:
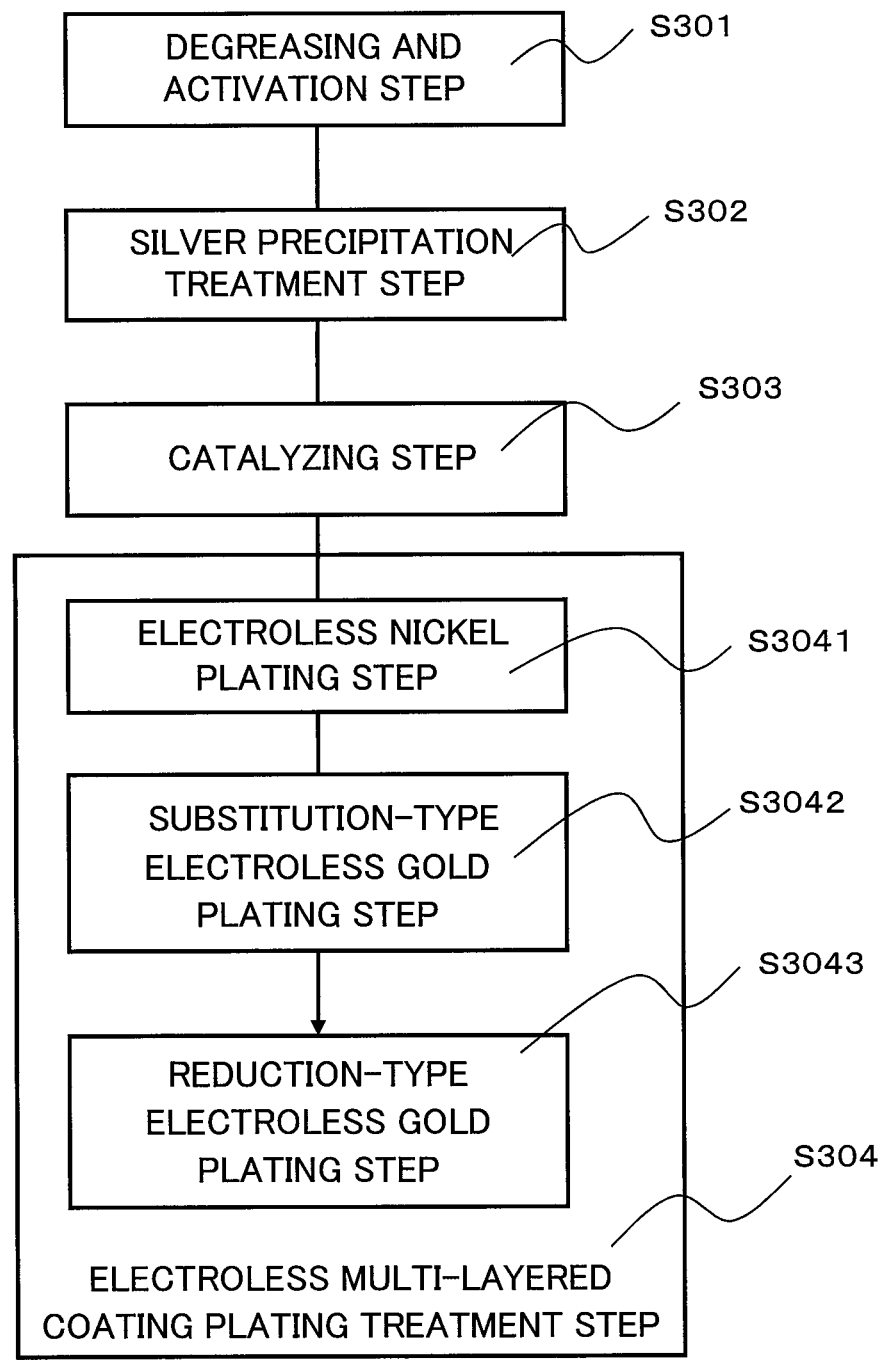
FIG. 10 illustrates a process flow according to a third embodiment of the present invention.

FIG. 10 illustrates a process flow according to a third embodiment of the present invention. In the first embodiment, the electroless plating method including the electroless multi-layered coating plating treatment step including the electroless nickel plating step, the electroless palladium plating step, and the substitution-type electroless gold plating step in this order is described. In contrast, in the third embodiment, an electroless plating method including an electroless multi-layered coating plating treatment step including an electroless nickel plating step, a substitution-type electroless gold plating step, and a reduction-type electroless gold plating step in this order is described. Other configurations are the same as those in the first embodiment.

In FIG. 10, Step S301, Step S302, and Step S303 are the same steps as Step S101, Step S102, and Step S103 of FIG. 1 in the first embodiment, respectively.

Next, an electroless multi-layered coating plating treatment step of Step S304 is performed.

First, an electroless nickel plating step of Step S3041 is performed. Step S3041 is the same step as Step S1041 of FIG. 1 in the first embodiment.

<Substitution-Type Electroless Gold Plating Step>

Figure 11:
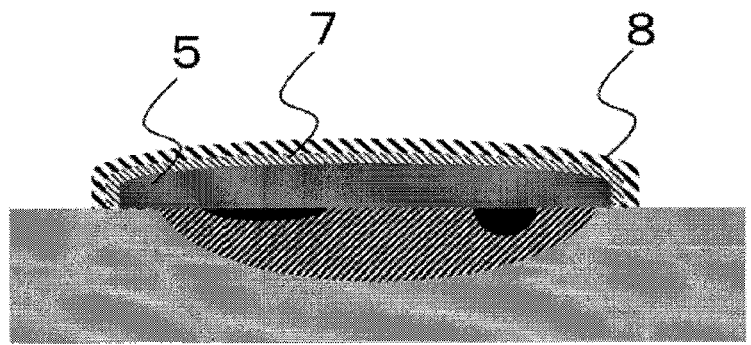
FIG. 11 is a sectional view illustrating a state in which the surface of the wiring pattern formed of a silver sintered body of FIG. 9 has been subjected to a substitution-type electroless gold plating step and a reduction-type electroless gold plating step.

Next, a substitution-type electroless gold plating step is described with reference to FIG. 11. FIG. 11 is a sectional view illustrating a state in which the surface of the wiring pattern 2 formed of a silver sintered body of FIG. 9 has been subjected to a substitution-type electroless gold plating step and a reduction-type electroless gold plating step.

In the substitution-type electroless gold plating step of Step S3042, as illustrated in FIG. 11, a substitution-type electroless gold plating coating 7 is formed on the electroless nickel plating coating 5 formed in the electroless nickel plating step. The step prior to the substitution-type electroless gold plating step of Step S3042 differs from that in the first embodiment, but the substitution-type electroless gold plating step is the same step as Step S1042 in the first embodiment and uses the same substitution-type gold plating liquid.

<Reduction-Type Electroless Gold Plating Step>

Next, in the reduction-type electroless gold plating step of Step S3043, as illustrated in FIG. 11, a reduction-type electroless gold plating coating 8 is formed on the substitution-type electroless gold plating coating 7 formed in the substitution-type electroless gold plating step. As a reduction-type electroless gold plating liquid to be used for the formation of the reduction-type electroless gold plating coating 8, a cyanogen-based gold plating liquid or a gold sulfite-based gold plating liquid, which has hitherto been used, may be used.

As the cyanogen-based reduction-type electroless gold plating liquid, for example, a plating liquid containing gold potassium cyanide as a supply source of gold, potassium cyanide or the like as a complexing agent, and sodium hydroxide, dimethylamine borane, or the like as a reducing agent, and having a pH adjusted to 13 is used. As the gold sulfite-based reduction-type gold plating liquid, for example, a plating liquid containing gold sodium sulfite as a supply source of gold, sodium sulfite or sodium thiosulfate as a complexing agent, and ascorbic acid or the like as a reducing agent, and having a pH adjusted to 7 is used.

As the reduction-type electroless gold plating conditions, the immersion time period of the LTCC substrate in the reduction-type electroless gold plating liquid and the liquid temperature of the reduction-type electroless gold plating liquid may appropriately be set so that the electroless gold plating coating can achieve a desired thickness. For example, in the case of using the cyanogen-based reduction-type electroless gold plating liquid, an electroless gold plating coating having a thickness of 0.7 µm is obtained by setting the liquid temperature and the plating time period to 80° C. and 30 minutes, respectively. It should be noted that, in general, the reduction-type electroless gold plating coating 8 can be varied in thickness as compared to the substitution-type electroless gold plating coating 7. For example, the reduction-type electroless gold plating coating 8 can be formed to have a thickness of from 0.1 µm to 1.0 µm. Thus, a glass ceramic substrate as illustrated in FIG. 11 is obtained.

As illustrated in FIG. 11, the glass ceramic substrate to be thus obtained through Steps S301 to S304 includes: the nickel plating coating 5 formed on the wiring pattern 2 formed of a silver sintered body including the silver particles 4 deposited on the glass component 3 and the glass component 3; the substitution-type electroless gold plating coating 7 formed on the nickel plating coating 5; and the reduction-type gold plating coating 8 formed on the substitution-type electroless gold plating coating 7. In addition, the silver particles 4 deposited on the glass component 3 are formed in the nickel plating coating 5.

At the time of an implementation step after the plating treatment, the Ni/Pd/Au plating coating of the first embodiment and the second embodiment may cause a reduction in wire bonding pull strength, a reduction in solder wettability, or the like depending on the implementation step. However, in the electroless plating method of the third embodiment, the electroless multi-layered coating plating treatment step is not limited to include the electroless nickel plating step, the electroless palladium plating step, and the substitution-type electroless gold plating step, and is intended to include the electroless nickel plating step, the substitution-type electroless gold plating step, and the reduction-type electroless gold plating step.

Therefore, the plating coating formed on the surface of the wiring pattern 2 formed of a silver sintered body is not limited to the Ni/Pd/Au plating coating, and it is possible to perform an implementation step that cannot be performed in the case of the Ni/Pd/Au plating coating. As a result, the implementation conditions can be expanded.

According to the third embodiment, the electroless plating method employs as its final step the reduction-type electroless gold plating as described above, and hence the gold plating coating can be formed to have a large thickness. In addition, the electroless multi-layered coating plating treatment step is not limited to one method, and therefore the kind of the multi-layered plating coating is not limited. As a result, the implementation conditions can be expanded to a wide variety of substrates.

Fourth Embodiment

Figure 12:
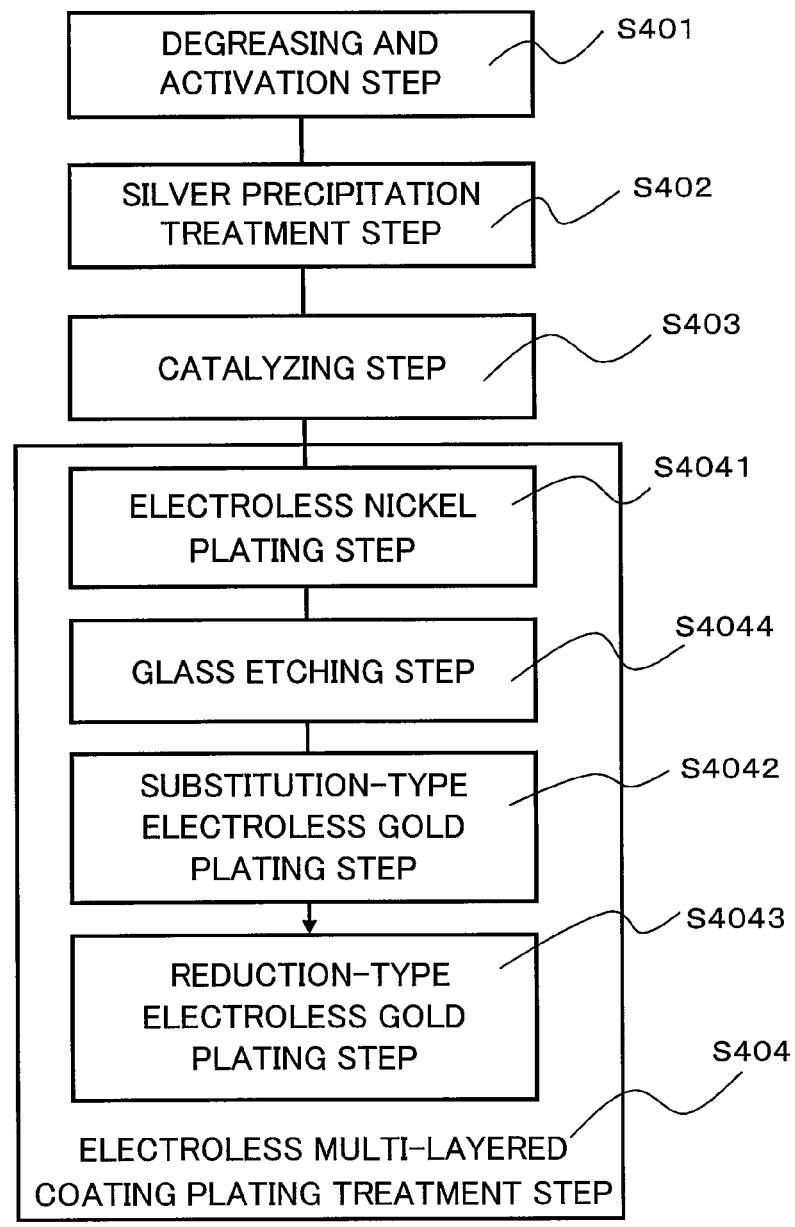
FIG. 12 illustrates a process flow according to a fourth embodiment of the present invention.

FIG. 12 illustrates a process flow according to a fourth embodiment of the present invention. In the third embodiment, the electroless plating method including the degreasing and activation step, the metal precipitation treatment step, the catalyzing step, the electroless nickel plating step, the substitution-type electroless gold plating step, and the reduction-type electroless gold plating step in this order is described. In contrast, in the fourth embodiment, an electroless plating method including, in addition to the steps of the third embodiment, a glass etching step between the substitution-type electroless gold plating step and the reduction-type electroless gold plating step is described.

As in the second embodiment, when the wiring patterns 2 formed of a silver sintered body have a narrow space therebetween, for example, have a space of 10 μm or less, gold may be anomalously deposited on the deposited silver in the substitution-type electroless gold plating step, to cause a short circuit between the patterns. In contrast, in the fourth embodiment, etching treatment is performed between the substitution-type electroless gold plating step and the reduction-type electroless gold plating step. Other configurations are the same as those in the third embodiment.

In FIG. 12, Step S401, Step S402, and Step S403 are the same steps as Step S301, Step S302, and Step S303 of FIG. 10 in the third embodiment, respectively.

In addition, an electroless nickel plating step (Step S4041), a substitution-type electroless gold plating step (Step S4042), and a reduction-type electroless gold plating treatment step (Step S4043) in an electroless multi-layered coating plating treatment step of Step S404 are the same steps as Step S3041, Step S3042, and Step S3043 in Step S304 of FIG. 10 in the third embodiment, respectively.

It should be noted that the process flow of the fourth embodiment differs from that of the third embodiment in that a glass etching treatment step of Step S4044 is added between Step S4041 and Step S4042. Now, Step S4044 is hereinafter described in detail.

The glass etching treatment step of Step S4044 is the same step as Step S2044 of FIG. 9 in the second embodiment, and uses the same glass etching liquid.

The glass ceramic substrate to be thus obtained through Steps S401 to S404 is the same as that to be obtained in the third embodiment. That is, as illustrated in FIG. 11, the glass ceramic substrate includes: the nickel plating coating 5 formed on the wiring pattern 2 formed of a silver sintered body including the silver particles 4 deposited on the glass component 3 and the glass component 3; the substitution-type electroless gold plating coating 7 formed on the nickel plating coating 5; and the reduction-type gold plating coating 8 formed on the substitution-type electroless gold plating coating 7. In addition, the silver particles 4 deposited on the glass component 3 are formed in the nickel plating coating 5.

Such electroless plating method can suppress the anomalous deposition of gold. As a result, a short circuit between the patterns can be prevented.

As described above, the electroless plating method according to the fourth embodiment can concurrently achieve the effects obtained in the second embodiment and third embodiment.

It should be noted that the methods according to the first embodiment to the fourth embodiment each include a pure water washing treatment step of washing the LTCC substrate by immersing the LTCC substrate in pure water between the respective steps. In addition, in the pure water washing treatment step, the LTCC substrate is preferably washed with pure water for about 1 minute.

In addition, the silver precipitation treatment step can remarkably enhance a silver precipitating effect by subjecting the LTCC substrate to ultrasonic treatment while the LTCC substrate is immersed in the silver precipitation treatment liquid. This is because that the ultrasonic treatment promotes dissolution of the glass component 3, and ultrasonic vibration promotes redeposition of the silver component because the silver component eluted through the dissolution of the glass component 3 is dissolved to be saturated in the silver precipitation treatment liquid. Further, in the case of performing ultrasonic treatment as just described, the immersion time period can be set shorter than usual.

Further, the electroless plating methods according to the first embodiment to the fourth embodiment can be applied not only to the LTCC substrate, but also to a wide variety of substrates.

In addition, the electroless plating coatings in the first embodiment to the fourth embodiment are not limited to the Ni/Pd/Au plating coating and the Ni/Au plating coating, and other multi-layered plating coatings can be employed.

EXAMPLES

Table 1 shows operation conditions and results of examples using LTCC substrates corresponding to the first embodiment, the second embodiment, and Comparative Example. Table 2 shows operation conditions and results of Examples using LTCC substrates corresponding to the third embodiment and fourth embodiment. Table 3 shows operation conditions and results of Examples using alumina ceramic substrates corresponding to the first embodiment. Table 4 shows operation conditions and results of Examples using alumina ceramic substrates corresponding to the third embodiment. Table 5 shows anomalous deposition states of palladium or gold between patterns in Examples 1 to 36 according to the present invention and Comparative Examples 1 and 2.

The present invention is hereinafter described in detail by way of Examples, but the present invention is not limited thereto.

Examples 1 to 6: First Embodiment

A LTCC substrate including the insulating base material 1 formed of glass ceramic measuring 20 mm in width, 20 mm in length, and 500 μm in thickness, and a metal sintered body containing as a main component silver was used. The LTCC substrate was subjected to a degreasing and activation treatment step, a silver precipitation treatment step, and a catalyzing step of providing a palladium catalyst in accordance with the method described in the first embodiment. In the degreasing and activation treatment step, the LTCC substrate was subjected to degreasing treatment by using EETOREX 72 (manufactured by Electroplating Engineers of Japan Ltd.), and then washed with pure water for 1 minute, followed by activation treatment by using EETOREX 62 (manufactured by Electroplating Engineers of Japan Ltd.).

After the substrate was immersed in pure water and left for 1 minute, the substrate was taken out therefrom, and subjected to the silver precipitation treatment step in accordance with the first embodiment by changing the silver precipitation treatment liquid, the liquid temperature, the treatment time period, the presence or absence of ultrasonic treatment, and the time period of the ultrasonic treatment. Thus, the silver particles 4 were precipitated on the glass component 3 present on the surface of the wiring pattern 2 formed of a silver sintered body. As shown in Table 1, the changed conditions were as follows: the concentrations of the first reducing agent and second reducing agent in the silver precipitation treatment liquid were set to 5 wt % and 10 ppm, respectively; the liquid temperature was set to 85° C.; and in addition, the following conditions of the precipitation treatment time period, glass etching, and ultrasonic treatment were combined.
Precipitation treatment time period: 1 minute, 5 minutes, or 10 minutes
Glass etching: present or absent
Ultrasonic treatment: present or absent After that, the substrate was immersed in pure water and left for 1 minute, and then taken out therefrom, followed by being immersed in LECTROLESS AC-2 (manufactured by Electroplating Engineers of Japan Ltd.) for 1 minute. After that, the substrate was subjected to a washing step by being immersed in pure water and left for 1 minute. Thus, the substrate was subjected to pretreatment steps.

Next, LECTROLESS NP7600 (manufactured by Electroplating Engineers of Japan Ltd.) was used as a nickel plating liquid and was heated to 85° C. The substrate was immersed in the nickel plating liquid at the temperature for 20 minutes in accordance with the coating formation method described in the first embodiment. Thus, the electroless nickel plating coating 5 having a thickness of 4 μm was formed on the wiring pattern 2 formed of a silver sintered body formed of a metal sintered body.

Then, after water washing treatment for 1 minute, the substrate was subjected to the electroless palladium plating step in accordance with the first embodiment, to form the electroless palladium plating coating 6 having a thickness of 0.1 μm. After that, the substrate was subjected to the electroless gold plating step, to form the electroless gold plating coating 7 having a thickness of 0.05 μm. In the electroless palladium plating step, LECTROLESS Pd2000S (manufactured by Electroplating Engineers of Japan Ltd.) was used, and the substrate was immersed therein under the condition of a liquid temperature of 50° C. for 10 minutes.

In addition, in the electroless gold plating step, LECTROLESS FX-5 (manufactured by Electroplating Engineers of Japan Ltd.) was used, and the substrate was immersed therein under the condition of a liquid temperature of 85° C. for 5 minutes. It should be noted that the thickness of each of the plating coatings was measured by using an X-ray fluorescence film thickness measuring apparatus.

Examples 7 to 12: Second Embodiment

The same LTCC substrate as in Example 1 was used and subjected to pretreatment steps of degreasing and activation treatment, providing a palladium catalyst, and the like in the same manner as in Example 1. After that, in accordance with the second embodiment, the substrate was subjected to the electroless nickel plating step, and then subjected to water washing treatment for 1 minute. After that, the substrate was subjected to glass etching treatment in accordance with the glass etching step described in the second embodiment. After that, the substrate was subjected to the electroless palladium plating step and the substitution-type electroless gold plating step. The reagents used in the steps were the same as in Example 1.

TABLE 1

| | | Concentration of reducing agent | | | Precipitation | | |
|---|---|---|---|---|---|---|---|
| | | First reducing agent (wt %) | Second reducing agent (ppm) | Liquid temperature (° C.) | treatment time period (min) | Ultrasonic treatment | Glass etching |
| Example | 1 | 5 | 10 | 85 | 1 | Absent | Absent |
| | 2 | 5 | 10 | 85 | 1 | Present | Absent |
| | 3 | 5 | 10 | 85 | 5 | Absent | Absent |
| | 4 | 5 | 10 | 85 | 5 | Present | Absent |
| | 5 | 5 | 10 | 85 | 10 | Absent | Absent |
| | 6 | 5 | 10 | 85 | 10 | Present | Absent |
| | 7 | 5 | 10 | 85 | 1 | Absent | Present |
| | 8 | 5 | 10 | 85 | 1 | Present | Present |

TABLE 1-continued

|  | First reducing agent (wt %) | Second reducing agent (ppm) | Liquid temperature (° C.) | Precipitation treatment time period (min) | Ultrasonic treatment | Glass etching |
|---|---|---|---|---|---|---|
| 9 | 5 | 10 | 85 | 5 | Absent | Present |
| 10 | 5 | 10 | 85 | 5 | Present | Present |
| 11 | 5 | 10 | 85 | 10 | Absent | Present |
| 12 | 5 | 10 | 85 | 10 | Present | Present |
| Comparative Example 1 | 5 | 10 | 85 | 1 | Absent | Absent |

Examples 13 to 18: Third Embodiment

The same LTCC substrate as in Example 1 was used and subjected to pretreatment steps of degreasing and activation treatment, providing a palladium catalyst, and the like in the same manner as in Example 1. After that, in accordance with the third embodiment, the substrate was subjected to the electroless nickel plating step, and then subjected to water washing treatment for 1 minute. After that, the substrate was subjected to the electroless gold plating step in accordance with the third embodiment, and then subjected to water washing treatment for 1 minute. After that, the substrate was subjected to the reduction-type electroless gold plating step in accordance with the third embodiment, to form the reduction-type electroless gold plating coating 8 having a thickness of 0.1 μm. In the reduction-type electroless plating step, LECTROLESS FX-5 (manufactured by Electroplating Engineers of Japan Ltd.) was used, and the substrate was immersed therein under the condition of a liquid temperature of 85° C. for 10 minutes. Besides, the reagents used in the steps were the same as in Example 1.

Examples 19 to 24: Fourth Embodiment

The same LTCC substrate as in Example 1 was used and subjected to pretreatment steps of degreasing and activation treatment, providing a palladium catalyst, and the like in the same manner as in Example 1. After that, in accordance with the fourth embodiment, the substrate was subjected to the electroless nickel plating step, and then subjected to water washing treatment for 1 minute. After that, the substrate was subjected to glass etching treatment in accordance with the glass etching step described in the fourth embodiment. After that, the substrate was subjected to the electroless gold plating step and the reduction-type electroless gold plating step. The reagents used in the steps were the same as in Example 1.

TABLE 2

|  |  | First reducing agent (wt %) | Second reducing agent (ppm) | Liquid temperature (° C.) | Precipitation treatment time period (min) | Ultrasonic treatment | Glass etching |
|---|---|---|---|---|---|---|---|
| Example | 13 | 5 | 10 | 85 | 1 | Absent | Absent |
|  | 14 | 5 | 10 | 85 | 1 | Present | Absent |
|  | 15 | 5 | 10 | 85 | 5 | Absent | Absent |
|  | 16 | 5 | 10 | 85 | 5 | Present | Absent |
|  | 17 | 5 | 10 | 85 | 10 | Absent | Absent |
|  | 18 | 5 | 10 | 85 | 10 | Present | Absent |
|  | 19 | 5 | 10 | 85 | 1 | Absent | Present |
|  | 20 | 5 | 10 | 85 | 1 | Present | Present |
|  | 21 | 5 | 10 | 85 | 5 | Absent | Present |
|  | 22 | 5 | 10 | 85 | 5 | Present | Present |
|  | 23 | 5 | 10 | 85 | 10 | Absent | Present |
|  | 24 | 5 | 10 | 85 | 10 | Present | Present |
| Comparative Example | 2 | 5 | 10 | 85 | 1 | Absent | Absent |

Examples 25 to 30: First Embodiment

An alumina ceramic substrate including the insulating base material 1 formed of alumina ceramic measuring 20 mm in width, 20 mm in length, and 500 μm in thickness, and a metal sintered body containing as a main component tungsten or molybdenum was used. The alumina ceramic substrate was treated in accordance with the first embodiment, and the degreasing and activation treatment was performed by using ETW (manufactured by WORLD METAL Co., Ltd.).

The substrate was immersed in pure water and left for 1 minute, and then taken out therefrom. After that, the substrate was subjected to pretreatment steps of precipitation treatment and providing a palladium catalyst in the same manner as in Example 1 in accordance with the first embodiment. After that, in accordance with the first embodiment, the substrate was subjected to the electroless nickel plating step and then subjected to water washing treatment for 1 minute, followed by being subjected to the electroless palladium plating step and the substitution-type electroless gold plating step. The reagents used in the steps were the same as in Example 1, except for the reagent in the degreasing and activation step.

TABLE 3

| | | Concentration of reducing agent | | | Precipitation | | |
|---|---|---|---|---|---|---|---|
| | | First reducing agent (wt %) | Second reducing agent (ppm) | Liquid temperature (° C.) | treatment time period (min) | Ultrasonic treatment | Glass etching |
| Example | 25 | 5 | 10 | 85 | 1 | Absent | Absent |
| | 26 | 5 | 10 | 85 | 1 | Present | Absent |
| | 27 | 5 | 10 | 85 | 5 | Absent | Absent |
| | 28 | 5 | 10 | 85 | 5 | Present | Absent |
| | 29 | 5 | 10 | 85 | 10 | Absent | Absent |
| | 30 | 5 | 10 | 85 | 10 | Present | Absent |

Examples 31 to 36: Third Embodiment

The same alumina ceramic substrate as in Example 25 was used and subjected to pretreatment steps of degreasing and activation treatment and providing a palladium catalyst in the same manner as in Example 25. After that, in accordance with the third embodiment, the substrate was subjected to the electroless nickel plating step, and then subjected to water washing treatment for 1 minute. After that, the substrate was subjected to the electroless gold plating step in accordance with the third embodiment and then subjected to water washing treatment for 1 minute, followed by being subjected to the reduction-type electroless gold plating step in accordance with the third embodiment. The reagents used in the steps were the same as in Example 1.

TABLE 4

| | | Concentration of reducing agent | | | Precipitation | | |
|---|---|---|---|---|---|---|---|
| | | First reducing agent (wt %) | Second reducing agent (ppm) | Liquid temperature (° C.) | treatment time period (min) | Ultrasonic treatment | Glass etching |
| Example | 31 | 5 | 10 | 85 | 1 | Absent | Absent |
| | 32 | 5 | 10 | 85 | 1 | Present | Absent |
| | 33 | 5 | 10 | 85 | 5 | Absent | Absent |
| | 34 | 5 | 10 | 85 | 5 | Present | Absent |
| | 35 | 5 | 10 | 85 | 10 | Absent | Absent |
| | 36 | 5 | 10 | 85 | 10 | Present | Absent |

Comparative Example 1

The same LTCC substrate as in Example 1 was used and subjected to electroless plating. The difference from Example 1 was that the silver precipitation treatment step was omitted, and other conditions were exactly the same as in Example 1.

Comparative Example 2

The same LTCC substrate as in Example 13 was used and subjected to electroless plating. The difference from Example 13 was that the silver precipitation treatment step was omitted, and other conditions were exactly the same as in Example 13.

The presence or absence of voids shown in Table 5 was determined by cross section processing of the wiring pattern by focused ion beam (FIB) after the electroless plating, followed by observation of the cross section by scanning ion microscopy (SIM) (at a magnification of from 100 to 500). The glass component 3 was measured at 10 points, and the number of voids right above the glass component 3 was counted.

The evaluation results shown in Table 5 revealed that, in Comparative Examples 1 and 2, in which electroless plating was performed without performing the silver precipitation treatment step, voids were generated in the nickel plating coating 5, but in Examples 1 to 36 corresponding to the first embodiment to the fourth embodiment of the present invention, in which the silver precipitation treatment step was performed, voids were hardly observed in the nickel plating coating 5.

In addition, the presence or absence of anomalous deposition state of palladium or gold between the patterns shown in Table 5 was determined by stereoscopic microscope observation (at a magnification of from 100 to 500). The case where the anomalous deposition accounted for 0% or more and less than 10% of the observation area was defined as no anomalous deposition, and was represented by Symbol "0" in Table 5. In addition, the case where the anomalous deposition accounted for 10 or more % and less than 50% of the observation area was defined as partial occurrence (to the extent that a short circuit does not occur), and was represented by Symbol "A" in Table 5. The case where the anomalous deposition accounted for more than 50% of the observation area was defined as occurrence on almost the entire surface, and was represented by Symbol "x" in Table 5.

TABLE 5

| | | Number of voids (point(s)) | Anomalous deposition state between patterns |
|---|---|---|---|
| Example | 1 | 1 | Δ |
| | 2 | 0 | Δ |
| | 3 | 0 | Δ |
| | 4 | 0 | Δ |

TABLE 5-continued

| | | Number of voids (point(s)) | Anomalous deposition state between patterns |
|---|---|---|---|
| | 5 | 0 | Δ |
| | 6 | 0 | x |
| | 7 | 1 | ○ |
| | 8 | 0 | ○ |
| | 9 | 0 | ○ |
| | 10 | 0 | ○ |
| | 11 | 0 | ○ |
| | 12 | 0 | ○ |
| | 13 | 1 | Δ |
| | 14 | 0 | Δ |
| | 15 | 0 | Δ |
| | 16 | 0 | Δ |
| | 17 | 0 | Δ |
| | 18 | 0 | x |
| | 19 | 2 | ○ |
| | 20 | 0 | ○ |
| | 21 | 0 | ○ |
| | 22 | 0 | ○ |
| | 23 | 0 | ○ |
| | 24 | 0 | ○ |
| | 25 | 3 | ○ |
| | 26 | 2 | ○ |
| | 27 | 1 | ○ |
| | 28 | 0 | ○ |
| | 29 | 0 | ○ |
| | 30 | 0 | ○ |
| | 31 | 3 | ○ |
| | 32 | 2 | ○ |
| | 33 | 1 | ○ |
| | 34 | 0 | ○ |
| | 35 | 0 | ○ |
| | 36 | 0 | ○ |
| Comparative Example | 1 | 7 | Δ |
| | 2 | 8 | Δ |

While the first embodiment to the fourth embodiment and Examples of the present invention have been described above, the configurations of the first embodiment to the fourth embodiment and Examples may be appropriately combined.

The invention claimed is:

1. An electroless plating method for a glass ceramic substrate comprising an insulating base material formed of glass ceramic, and a wiring pattern formed of a silver sintered body, the electroless plating method comprising:
a degreasing and activation treatment step of degreasing and activating a surface of the wiring pattern formed of a silver sintered body;
a catalyzing step of providing a catalyst onto the surface of the wiring pattern formed of a silver sintered body after the degreasing and activation treatment step; and
an electroless multi-layered coating plating treatment step of forming a multi-layered electroless plating coating on the surface of the wiring pattern formed of a silver sintered body on which the catalyst is provided,
the electroless plating method further comprising, between the degreasing and activation treatment step and the catalyzing step, a silver precipitation treatment step of dissolving and ionizing silver included in a glass component present on the surface of the wiring pattern formed of a silver sintered body after the degreasing and activation treatment step with a silver precipitation treatment liquid, and selectively redepositing the silver on the glass component, by executing a dissolving process and redepositing process with the silver precipitation treatment liquid having a pH adjusted to from 4 to 6 and having an acidic property,
wherein the silver precipitation treatment liquid comprises a first reducing agent or a combination of the first reducing agent and a second reducing agent,
the first reducing agent comprises a phosphoric acid compound or an organic acid, and the second reducing agent comprises an inorganic compound,
the catalyzing step comprising providing the catalyst also to the silver precipitated in the silver precipitation treatment step.

2. An electroless plating method according to claim 1, wherein the electroless multi-layered coating plating treatment step comprises:
an electroless nickel plating step of forming an electroless nickel plating coating on the surface of the wiring pattern formed of a silver sintered body on which the catalyst is provided;
an electroless palladium plating step of forming an electroless palladium plating coating on the electroless nickel plating coating; and
a substitution-type electroless gold plating step of forming a substitution-type electroless gold plating coating on the electroless palladium plating coating.

3. An electroless plating method according to claim 2, further comprising, between the electroless nickel plating step and the electroless palladium plating step, a glass etching treatment step of dissolving fine particles formed on glass ceramic with a glass etching liquid to remove the fine particles.

4. An electroless plating method according to claim 1, wherein the electroless multi-layered coating plating treatment step comprises:
an electroless nickel plating step of forming an electroless nickel plating coating on the surface of the wiring pattern formed of a silver sintered body on which the catalyst is provided;
a substitution-type electroless gold plating step of forming a substitution-type electroless gold plating coating on the electroless nickel plating coating; and
a reduction-type electroless gold plating step of forming a reduction-type electroless gold plating coating on the substitution-type electroless gold plating coating.

5. An electroless plating method according to claim 4, further comprising, between the electroless nickel plating step and the substitution-type electroless gold plating step, a glass etching treatment step of dissolving fine particles formed on glass ceramic with a glass etching liquid to remove the fine particles.

6. An electroless plating method according to claim 1, wherein the phosphoric acid compound comprises hypophosphorous acid, sodium hypophosphite, or potassium hypophosphite.

7. An electroless plating method according to claim 1, wherein the organic acid comprises formic acid or citric acid.

8. An electroless plating method according to claim 1, wherein the inorganic compound comprises iron(II) chloride, iron(II) sulfate, or sodium thiosulfate.

9. An electroless plating method according to claim 1, wherein the silver precipitation treatment step comprises precipitation and scattering of silver particles on the glass component present on the surface of the wiring pattern formed of the silver sintered body.

* * * * *